United States Patent [19]

Doan et al.

[11] Patent Number: 5,196,360
[45] Date of Patent: Mar. 23, 1993

[54] METHODS FOR INHIBITING OUTGROWTH OF SILICIDE IN SELF-ALIGNED SILICIDE PROCESS

[75] Inventors: Trung T. Doan; Gurtej S. Sandhu, both of Boise, Id.

[73] Assignee: Micron Technologies, Inc., Boise, Id.

[21] Appl. No.: 866,093

[22] Filed: Apr. 6, 1992

Related U.S. Application Data

[63] Continuation of Ser. No. 591,972, Oct. 2, 1990, abandoned.

[51] Int. Cl.$^5$ .................. H01L 21/366; H01L 21/283
[52] U.S. Cl. ..................... 437/41; 437/200; 748/DIG. 19; 748/DIG. 15
[58] Field of Search ............... 437/41, 44, 200; 357/675, 715; 748/DIG. 19, DIG. 15; 257/754, 757

[56] References Cited

U.S. PATENT DOCUMENTS

| | | | |
|---|---|---|---|
| 3,753,774 | 8/1973 | Veloric | 437/200 |
| 4,102,733 | 7/1978 | De La Moneda et al. | 437/200 |
| 4,577,391 | 3/1986 | Hsia et al. | 437/56 |
| 4,676,866 | 6/1987 | Tang et al. | 437/200 |
| 4,735,680 | 4/1988 | Yen | 437/200 |
| 4,755,479 | 7/1988 | Miura | 437/44 |
| 4,782,380 | 11/1988 | Shankar et al. | 357/71 |
| 4,839,301 | 6/1989 | Lee | 437/29 |
| 4,871,688 | 10/1989 | Lowley | 437/47 |
| 4,873,205 | 10/1989 | Critchlow et al. | 437/200 |
| 4,875,088 | 10/1989 | Egawa et al. | 357/67 |
| 4,906,588 | 3/1990 | Harrington, III | 437/44 |
| 4,920,073 | 4/1990 | Wei et al. | 437/200 |
| 4,923,822 | 5/1990 | Wang et al. | 437/41 |
| 4,943,537 | 7/1990 | Harrington, III | 437/34 |

FOREIGN PATENT DOCUMENTS 61-183942 8/1986 Japan ..................... 437/192

OTHER PUBLICATIONS

Kermani, A., et al., "The Effect of Processing . . . ", *Mat. Res. Soc. Sym. Proc.*, vol. 74, 1987, pp. 665-672.
Noël, J. P., et al., "Characteristics of dc magnetion . . . ", *J. Vac. Sci. Technol.*, A2(2), Apr.-Jun. 1984, pp. 284-287.
Wittmer, M., "Properties and Microelectronics . . . ", *J. Vac. Sci. Technol.*, A, vol. 3, No. 4, Jul.-Aug. 1985, pp. 1797-1803.
Wittmer, M., et al., "Application of TiN . . . ", *Thin Solid Films*, vol. 93, 1982, pp. 397-405.

*Primary Examiner*—T. N. Quach
*Attorney, Agent, or Firm*—Workman Nydegger Jensen

[57] ABSTRACT

The present invention is directed to methods for preparing silicide contact areas on integrated circuit devices which inhibit outgrowth of silicide and formation of potential short circuit paths between adjacent silicide contact areas. This may be achieved by depositing a nitrogen-rich titanium nitride layer over the conventional titanium layer prior to silicidation. In those regions on the integrated circuit device where titanium is deposited on spacer oxide regions separating adjacent silicide contact areas, excess nitrogen from the nitrogen-rich titanium nitride layer reacts with the titanium film to form titanium nitride. The final structure after silicidation contains titanium silicide contact areas separated by titanium nitride regions. The titanium nitride regions inhibit outgrowth of titanium silicide from the silicide contact areas. After silicidation, excess titanium nitride and titanium may be removed by etching.

17 Claims, 4 Drawing Sheets

METHODS FOR INHIBITING OUTGROWTH OF SILICIDE IN SELF-ALIGNED SILICIDE PROCESS

This application is a continuation of U.S. application Ser. No. 07/591,972 filed Oct. 2, 1990, for METHODS FOR INHIBITING OUTGROWTH OF SILICIDE IN SELF-ALIGNED SILICIDE PROCESS, abandoned.

BACKGROUND

1. The Field of the Invention

The present invention relates to the manufacture of semiconductor circuit devices. More particularly, the present invention is directed to methods for inhibiting outgrowth of titanium silicide between the gate electrode and the source/drain regions of standard MOS transistor structures by depositing a nitrogen-rich titanium nitride (TiN) layer on a titanium layer prior to silicidation.

2. Technology Review

Silicon semiconductor devices, such as standard MOS transistor structures, commonly include a silicide layer to provide a uniform electrical contact to gate, source, and drain electrodes. In the standard procedure for forming the silicide layers, titanium is deposited over a MOS transistor structure (typically having a polysilicon gate electrode, source/drain regions, and spacer oxides), followed by annealing in a nitrogen atmosphere. Silicon from the gate electrode and from the source/drain regions reacts with the titanium to form titanium silicide. Silicon dioxide is relatively unreactive with titanium when compared with silicon.

The furnace temperature and exposure time of the semiconductor device during the annealing process must be carefully controlled to prevent outgrowth of the titanium silicide from the gate electrode as well as suction of the silicon from the source/drain region to form short circuit paths between the gate electrode and the source/drain contacts.

The formation of short circuit paths between the gate electrode and the source/drain contacts represents a potential major obstacle for further shrinkage of semiconductor devices for ULSI applications. Therefore, it will be appreciated that what is needed in the art are methods for inhibiting outgrowth of titanium silicide between the gate electrode and the source/drain regions of integrated circuit devices, thereby inhibiting the formation of short circuit paths between the gate electrode and the source/drain contacts.

Such methods for inhibiting the outgrowth of silicide between the gate electrode and the source/drain regions of integrated circuit devices are disclosed and claimed herein.

BRIEF SUMMARY AND OBJECTS OF THE INVENTION

The present invention is directed to methods for inhibiting the outgrowth of silicide between the gate electrode and the source/drain regions of integrated circuit devices. In standard silicidation techniques, a titanium layer is deposited over a MOS transistor structure, followed by annealing in a nitrogen atmosphere. Silicon from the gate electrode and from the source/drain regions reacts with the titanium to form titanium silicide. Almost all of the titanium layer over the gate electrode and source/drain regions is consumed by the silicon to form titanium silicide. Over-annealing results in creeping of the silicide over the spacer oxide and the creation of short circuit paths.

According to the currently preferred process of the present invention, a titanium nitride layer is deposited on top of the titanium layer before silicidation. The titanium nitride layer is preferably nitrogen rich such that there is a stoichiometrically excess amount of nitrogen in relation to the titanium (for $TiN_x$, $x>1$). In those regions on the integrated circuit device where titanium is deposited on silicon dioxide (e.g., spacer oxide), excess nitrogen from the nitrogen-rich titanium nitride layer competes with silicon diffusing through the titanium silicide to react with the titanium. A significant amount of titanium nitride is formed over the spacer oxide between the gate and the source/drain regions to inhibit diffusion of silicon and the formation of titanium silicide over the spacer oxide.

The final structure after silicidation contains titanium silicide over the gate and the source/drain regions and titanium nitride (TiN) over the oxide (spacer and field) regions. Thus, outgrowth of titanium silicide from the gate, source, and drain regions is inhibited by the formation of TiN over the spacer oxide during silicidation.

It is, therefore, an object of the present invention to provide methods for inhibiting outgrowth of titanium silicide between the gate electrode and the source/drain regions of integrated circuit devices, thereby inhibiting the formation of short circuit paths between the gate electrode and the source/drain contacts.

These and other objects and features of the present invention will become more fully apparent from the following description and appended claims, or may be learned by the practice of the invention.

BRIEF DESCRIPTION OF THE DRAWINGS

In order to more fully understand the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered limiting in its scope, the invention and the presently understood best mode thereof will be described and explained with additional specificity and detail through the use of the accompanying drawings in which.

DETAILED DESCRIPTION OF THE PREFERRED EMBODIMENTS

Figure 1:
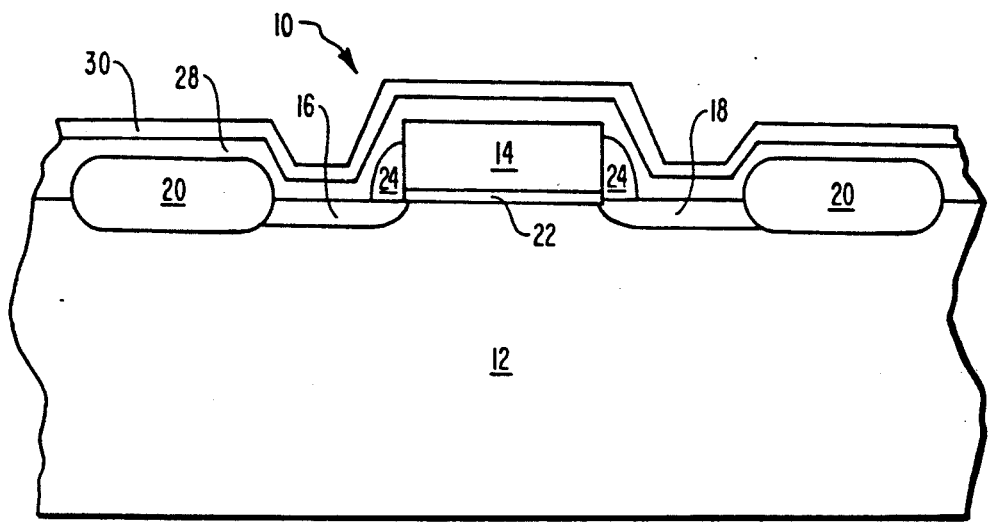
FIG. 1 is a cross-sectional view of a MOS transistor structure coated with a titanium layer and a nitrogen-rich titanium nitride layer.

The present invention is directed to methods for preparing silicide contact areas on integrated circuit devices which inhibit outgrowth of silicide and the formation of potential short circuit paths between adjacent silicide contact areas. The present invention is particularly adapted for use in the fabrication of standard MOS transistor structures having a polysilicon gate electrode, source/drain regions, and spacer oxides. The spacer oxides are important in electrically isolating the gate from the source and the gate from the drain.

In one embodiment within the scope of the present invention, a layer of nitrogen-rich titanium nitride is deposited over a standard MOS transistor structure having a titanium film deposited thereon. The MOS transistor structure and the titanium film thereon may be prepared according to standard industry processes. The nitrogen-rich titanium nitride is preferably deposited by reactive sputtering.

The term "nitrogen-rich titanium nitride," as used herein, means that there is a stoichiometrically excess amount of nitrogen in the titanium nitride. For example, nitrogen-rich titanium nitride may be expressed by the chemical formula $TiN_x$, where $x > 1$. In most cases x will be in the range from about 1 to about 2, preferably in the range from about 1 to about 1.6, and most preferably in the range from about 1.1 to about 1.3.

In reactive sputtering, a titanium target is bombarded by argon ions in the presence of nitrogen within a plasma. Titanium from the target reacts with nitrogen to form the titanium nitride. By controlling the amount of available nitrogen, the stoichiometric ratio of titanium to nitrogen can be controlled. Hence, in order to form nitrogen-rich titanium nitride, the titanium is reactively sputtered in the presence of excess nitrogen.

Silicidation, or the formation of the silicide contact layers for the gate, source, and drain regions, is accomplished by annealing the semiconductor device in a furnace. During silicidation, silicon from the gate electrode and from the source/drain regions reacts with the titanium to form titanium silicide. Silicon actually diffuses into the titanium layer; hence, silicon is referred to as the "moving species."

Silicon dioxide does not react to any significant degree with titanium, when compared to elemental silicon. In addition, silicon does not diffuse very rapidly through silicon dioxide, when compared to titanium silicide. Thus, for titanium silicide to form in those areas where the titanium is deposited over layers of silicon dioxide, silicon must diffuse through adjacent layers of titanium silicide.

According to the present invention, a silicon diffusion barrier is created between the gate silicide layer and the source and drain silicide layers to prevent silicon from diffusing and forming titanium silicide in those regions. Titanium nitride is one currently preferred diffusion barrier. Titanium nitride is formed in the region between the gate silicide layer and the source and drain silicide layers by excess nitrogen from the nitrogen-rich titanium nitride diffusing into and reacting with the titanium layer.

Reference is now made to the Figures wherein like parts are designated with like numerals throughout. Integrated circuit structure 10 is represented upon a silicon substrate 12. The integrated circuit structure, shown in the Figures as a standard MOS transistor structure, can be formed using conventional fabrication techniques and materials now known in the art or which may be developed and used in the future. Although the Figures illustrate by way of example a MOS transistor structure, those skilled in the art will understand that the principles of the present invention may be used with other integrated circuit structures.

Represented in the Figures are diagrammatic cross-sectional views of the integrated circuit structure 10 showing the structural changes which occur to the integrated circuit during the methods within the scope of the present invention. The integrated circuit structures are arranged in a planar fashion.

Figure 2:
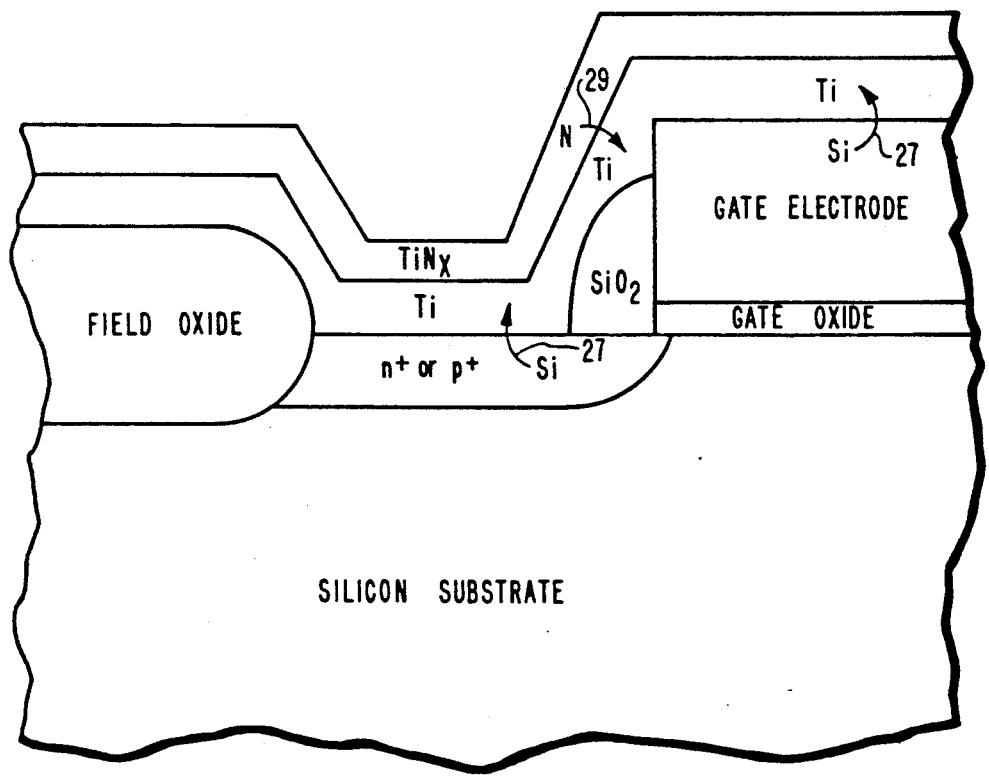
FIG. 2 is an enlarged cross-sectional view of the device shown in FIG. 1 illustrating the diffusion of atomic species during silicidation.

Reference is now made to FIGS. 1 and 2. Integrated circuit structure 10, shown as a standard MOS transistor structure, includes a gate electrode 14, source and drain regions 16 and 18, respectively, and field oxide regions 20. The source and drain regions 16, 18 are both doped either $n^+$ or $p^+$ according to conventional semiconductor fabrication techniques. The field oxide regions 20 preferably comprise silicon dioxide ($SiO_2$) and function to isolate integrated circuit structures from each other. A thin gate oxide layer 22, preferably comprising silicon dioxide, functions to isolate the gate electrode 14 from the silicon substrate 12. As shown in FIG. 1, gate electrode 14 is vertically offset from the source and drain regions 16, 18. Spacer oxides 24, also comprising silicon dioxide, function to electrically insulate the gate electrode 14 from the source and drain regions. As shown in FIG. 1, spacer oxides 24 extend vertically upward from the source an drain regions 16, 18 to somewhat below the uppermost surface of the gate electrode region 14.

A titanium layer 28 is shown deposited over the entire integrated circuit structure described above. The titanium layer 28 may be deposited according to conventional fabrication techniques and materials now known in the art or which may be developed and used in the future. One currently preferred method of depositing the titanium layer is by sputtering with argon.

A nitrogen-rich titanium nitride layer 30 is shown deposited over the titanium layer 28. As described above, the nitrogen-rich titanium nitride layer contains a stoichiometric excess of nitrogen. Titanium nitride layer 30 may be deposited according to known fabrication techniques. One currently preferred method of depositing the titanium nitride is by reactive sputtering with argon and nitrogen. In reactive sputtering, argon ions in a plasma sputter off titanium from a titanium target and react with nitrogen gas in the plasma to form titanium nitride. By controlling the amount of nitrogen gas in the plasma, it is possible to control the ratio of titanium to nitrogen such that excess nitrogen is present.

FIG. 2 is an enlarged cross-sectional view of the integrated circuit structure shown in FIG. 1 illustrating the diffusion of atomic species during silicidation. Silicon from the gate electrode 14 and from the source and drain regions 16 and 18 diffuses into the titanium layer 28 as schematically represented by arrow 27 to form titanium silicide. Nitrogen from the nitrogen-rich titanium nitride layer 30 diffuses into the titanium layer 28 as schematically represented by arrow 29 to form titanium nitride. Care must be taken during silicidation such that too much silicon is not removed from the source and drain regions. Otherwise, pitting of the silicon substrate can occur which may interfere with the integrated circuit's normal operation.

Titanium silicide is the principal reaction product in the contact areas over the gate, source, and drain regions, rather than titanium nitride, because the titanium silicide reaction is thermodynamically favored. Titanium nitride, on the other hand, is the principal reaction product over the spacer and field regions because there is more nitrogen than silicon available for reaction with titanium.

Figure 3:
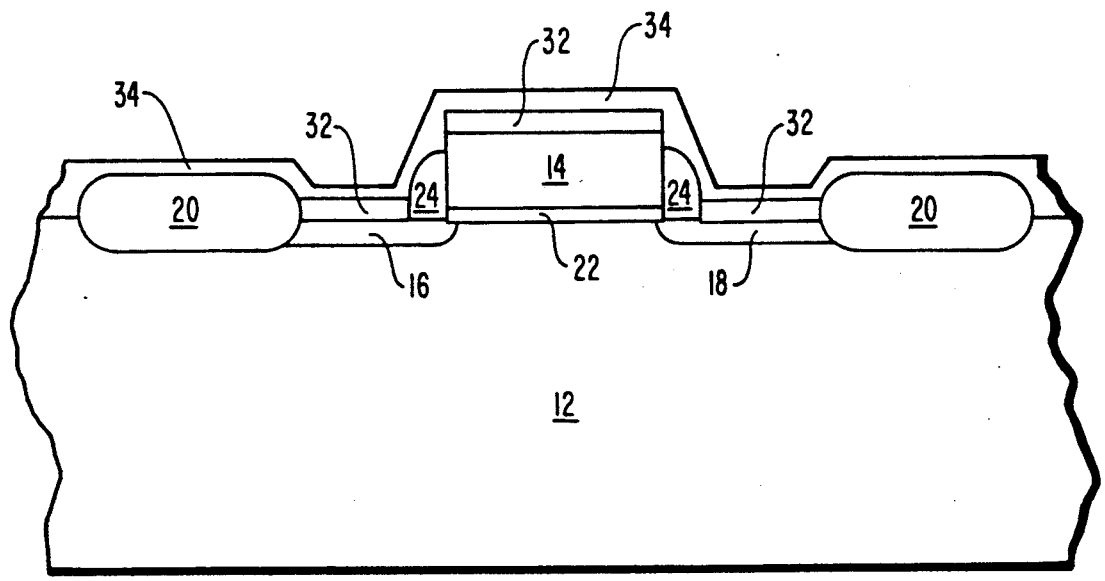
FIG. 3 is a cross-sectional view of the device shown in FIG. 1 after silicidation.

FIG. 3 depicts integrated circuit structure 10 after silicidation. As discussed above, a titanium silicide layer 32 is formed over the gate, source, and drain regions of the integrated circuit structure. A new titanium nitride layer 34 is formed by reaction between excess nitrogen from the nitrogen-rich titanium nitride layer 30 and titanium layer 28. Some unreacted titanium (not shown) may still remain after silicidation.

Figure 4:
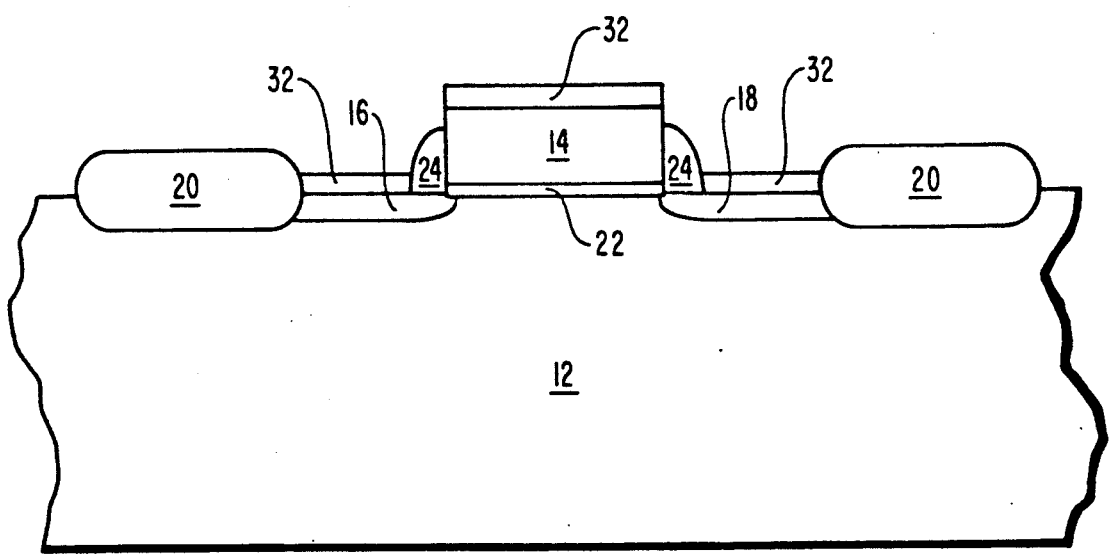
FIG. 4 is a cross-sectional view of the device shown in FIG. 3 after the titanium nitride layer is removed by etching.

After silicidation, the titanium nitride layer 34 and any unreacted titanium are removed from the integrated circuit structure through conventional etching techniques as are known in the art. FIG. 4 illustrates integrated circuit structure 10 after the titanium nitride layer and unreacted titanium are removed.

Figure 5:
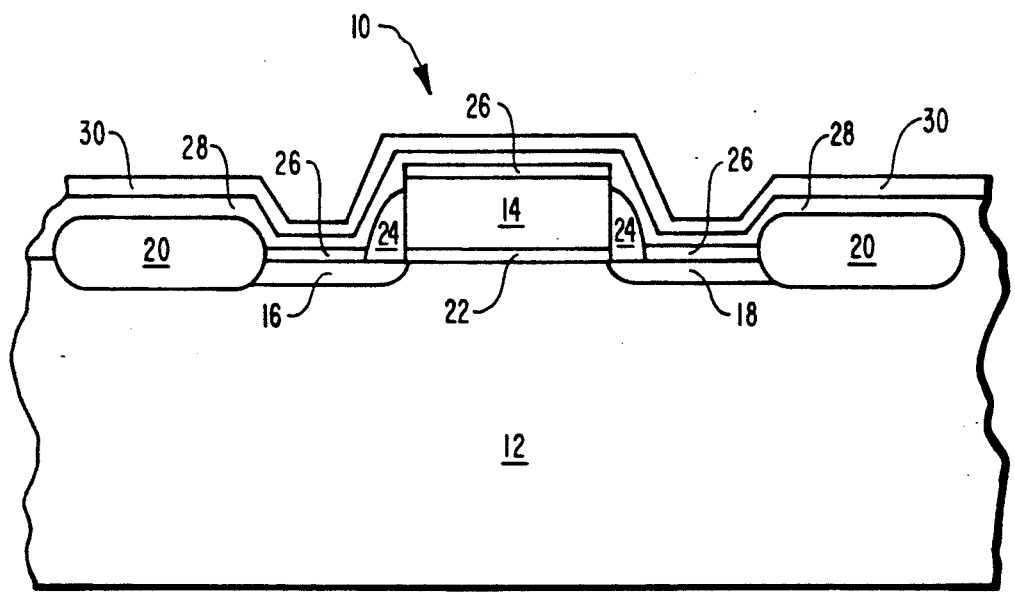
FIG. 5 is a cross-sectional view of a MOS transistor structure having a layer of silicon which has been selectively deposited over the gate electrode and over the source/drain regions prior to depositing a titanium layer and a nitrogen-rich titanium nitride layer over the transistor structure.

FIG. 5 illustrates the integrated circuit structure of FIG. 1, except that a silicon layer 26 is shown over the gate electrode 14 and over the source and drain regions 16, 18. During fabrication of the integrated circuit structure, the silicon layer 26 is preferably selectively deposited over the existing silicon structures. Either polysilicon or epitaxial silicon may be deposited according to fabrication techniques known in the art. Although use of silicon layer 26 is not necessary, the silicon layer does decrease the risk of pitting the silicon substrate during silicidation by removing too much silicon from the source and drain regions.

Figure 6:
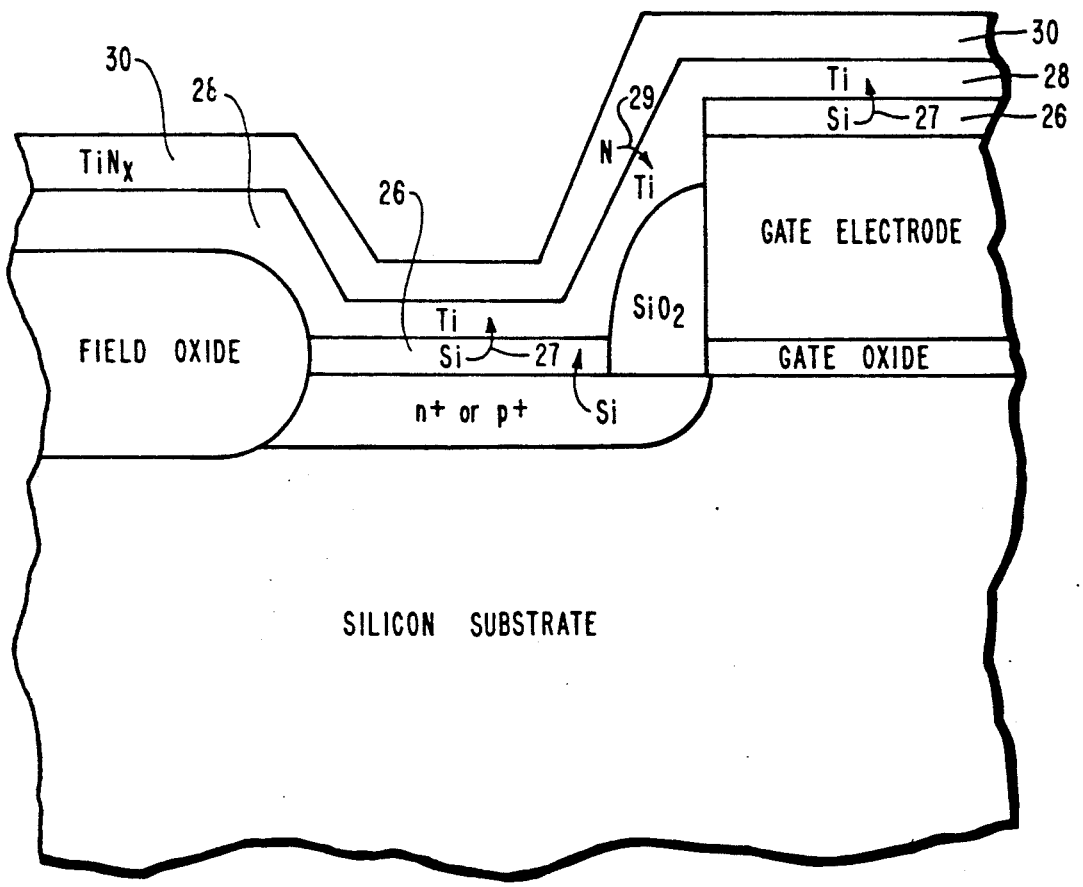
FIG. 6 is an enlarged cross-sectional view of the device shown in FIG. 5 illustrating the diffusion of atomic species during silicidation.

FIG. 6 is an enlarged cross-sectional view of the integrated circuit structure shown in FIG. 5 illustrating the diffusion of atomic species during silicidation. Silicon from the silicon layer 26 diffuses into the titanium layer 28 as schematically represented by arrow 27 to form titanium silicide. Nitrogen from the nitrogen-rich titanium nitride layer 30 diffuses into the titanium layer 28 as schematically represented by arrow 29 to form titanium nitride.

Figure 7:
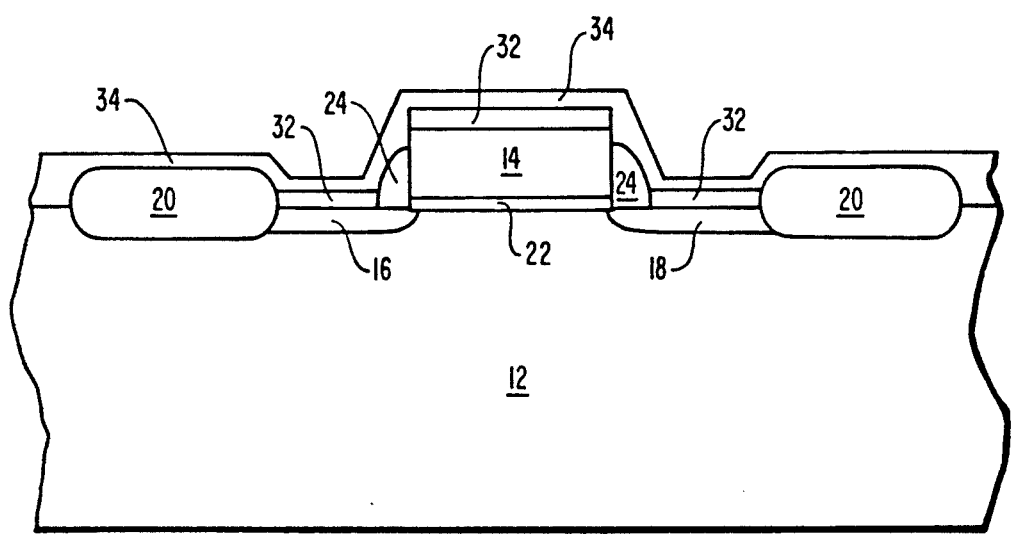
FIG. 7 is a cross-sectional view of the device shown in FIG. 5 after silicidation.

FIG. 7 depicts the integrated circuit structure of FIG. 5 after silicidation. It will be appreciated that the integrated circuit structure of FIG. 7 is nearly identical to the circuit structure of FIG. 3. Hence, the methods within the scope of the present invention effectively inhibit silicide outgrowth with or without the use of a selective silicon layer 26.

Various silicidation methods which inhibit outgrowth of silicide contact areas on silicon integrated circuit devices will be further clarified by a consideration of the following examples, which are intended to be purely exemplary of the use of the invention and should not be viewed as a limitation on any claimed embodiment.

EXAMPLE 1

This example presents one method within the scope of the present invention for preparing silicide contact areas on integrated circuit devices which inhibits formation of short circuit paths between adjacent silicide contact areas. In this example, a standard MOS transistor structure is fabricated according to known techniques in the art. The MOS transistor structure has silicon gate, source, and drain contact areas separated by a silicon dioxide spacer.

A thin titanium film is deposited over the MOS transistor structure by sputtering of titanium in an argon plasma. A nitrogen-rich titanium nitride film is deposited over the titanium film by reactive sputtering of titanium in an argon and nitrogen plasma. The amount of nitrogen in the plasma is controlled such that the ratio of nitrogen to titanium in the final titanium nitride is maintained in the range from 1.1 to 1.3.

The MOS transistor structure is then annealed in a high temperature furnace according to conventional silicidation techniques. During silicidation, titanium silicide contact areas form over the gate, source and drain silicon contact areas. Also during silicidation, titanium nitride is formed over the silicon oxide spacers. This titanium nitride inhibits formation of titanium silicide short circuit paths between adjacent titanium silicide contact areas. After silicidation, excess titanium nitride and unreacted titanium are etched from the MOS transistor structure, using standard etching techniques known in the art.

EXAMPLE 2

In this example, silicide contact areas on integrated circuit devices are prepared according to the procedure of Example 1, except that a layer of silicon is selectively deposited over the gate, source, and drain contact areas prior to depositing the titanium layer. Outgrowth of titanium silicide short circuit paths between adjacent silicide contact areas is inhibited by the formation of titanium nitride between the gate and the source and between the gate and the drain regions of the integrated circuit device.

EXAMPLE 3

In this example, silicide contact areas on integrated circuit devices are prepared according to the procedure of Example 1, except that a layer of tungsten and a layer of tungsten nitride is deposited on the integrated circuit device instead of titanium and titanium nitride, respectively.

EXAMPLE 4

In this example, silicide contact areas on integrated circuit devices are prepared according to the procedure of Example 1, except that a layer of cobalt and a layer of cobalt nitride is deposited on the integrated circuit device instead of titanium and titanium nitride, respectively.

EXAMPLE 5

In this example, silicide contact areas on integrated circuit devices are prepared according to the procedure of Example 1, except that the amount of nitrogen in the plasma is controlled such that the ratio of nitrogen to titanium in the final titanium nitride is maintained in the range from 1.5 to 1.6.

Although the foregoing discussion has focused on application of the present invention to MOS transistor structures, it will be appreciated that the principles within the scope of the present invention may be adapted by those skilled in the art to silicon integrated circuits in which there is a potential for adjacent silicide contact areas to merge during silicidation and form short circuit paths.

From the foregoing, it will be appreciated that the present invention provides methods for inhibiting outgrowth of adjacent silicide contact areas which have the potential for forming short circuit paths between the silicide contact areas. More specifically, the present invention inhibits outgrowth of silicide between the gate electrode and the source/drain regions of standard MOS transistor structures, thereby inhibiting the formation of short circuit paths between the gate electrode and the source/drain silicide contact areas.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for preparing silicide contact areas on integrated circuit devices which inhibit formation of short circuit paths between adjacent silicide contact areas over silicon dioxide spacer regions formed between said silicide contact areas, said method comprising the steps of:
   (a) fabricating an integrated circuit structure having a plurality of upper and lower silicon contact areas situated on a silicon substrate,
      each said lower silicon contact area having a top and a bottom surface,
      each said upper silicon contact area having a top, a bottom and multiple vertical surfaces, said upper silicon contact area being vertically offset from each said lower silicon contact area by a substantially horizontally-oriented offset area,
      each said offset area comprising silicon dioxide and being situated substantially under the entire bottom surface of one of said upper silicon contact areas, and at least partially over the top surface of one of said lower silicon contact areas;
   (b) forming silicon dioxide spacer regions on said silicon substrate, each said silicon dioxide spacer region being in contact with:
      the top surface of one of said lower silicon contact areas,
      at least one of said vertical surfaces of one of said upper silicon contact areas, and below the top surface of one of said upper silicon contact areas, and each said offset area;
   (c) depositing a metal film directly over and onto the integrated circuit structure, said top surface of each said lower silicon contact area, said top and vertical surfaces of each said upper silicon contact area, and said silicon dioxide spacer regions, said metal being capable of reacting with silicon to form a metal silicide and with nitrogen to form a metal nitride, said metal nitride being capable of inhibiting diffusion of silicon;
   (d) depositing a nitrogen rich metal nitride film over said metal film;
   (e) annealing said integrated circuit structure and forming a plurality of vertically offset upper and lower metal silicide regions, each said lower metal silicide region having:
      a top surface and being substantially over the entire top surface of one of said lower silicon contact areas and partially over the silicon spacer region that is on said top surface of said one of said lower silicon contact areas,
      each said upper metal silicide region having a top surface and being substantially over the entire top surface of one of said upper silicon contact areas, substantially above each said vertical surface of said one of said upper silicon contact areas and substantially above and completely out of contact with the silicon dioxide spacer region contacting said vertical surfaces of said one of said upper silicon contact areas, and forming metal nitride regions: in said metal film,
      substantially entirely over the top surface of each said upper and lower metal silicide regions, and both in contact with and substantially entirely over each said silicon dioxide spacer regions, so as to inhibit diffusion of silicon from said silicon contact areas not covered by said spacer oxide regions; and
   (f) etching excess metal rich metal nitride film and metal film from said top surfaces of said upper and lower metal silicide regions, and from said silicon dioxide spacer regions, and generally from said integrated circuit structure.

2. A method for preparing silicide contact areas on integrated circuit devices defined in claim 1, further comprising the step of selectively depositing a silicon layer over the plurality of silicon contact areas of the integrated circuit structure prior to depositing the metal film over the integrated circuit structure.

3. A method for preparing silicide contact areas on integrated circuit devices as defined in claim 1, wherein the metal film is deposited by sputtering.

4. A method for preparing silicide contact areas on integrated circuit devices as defined in claim 1, wherein the nitrogen-rich metal nitride film is deposited by reactive sputtering.

5. A method for preparing silicide contact areas on integrated circuit devices as defined in claim 1, wherein the metal comprises titanium.

6. A method for preparing silicide contact areas on integrated circuit devices as defined in claim 5, wherein the ratio of nitrogen to titanium in the nitrogen-rich titanium nitride film is in the range from about 1 to about 2.

7. A method for preparing silicide contact areas on integrated circuit devices as defined in claim 5, wherein the ratio of nitrogen to titanium in the nitrogen-rich titanium nitride film is in the range from about 1.1 to about 1.3.

8. A method for preparing silicide contact areas on integrated circuit devices as defined in claim 1, wherein the metal comprises tungsten.

9. A method for preparing silicide contact areas on integrated circuit devices as defined in claim 1, wherein the metal comprises cobalt.

10. A method for preparing titanium silicide contact areas on MOS transistor structures which inhibit formation of titanium silicide short circuit paths between the gate electrode regions and the source/drain regions of the MOS transistor structure, the method comprising the steps of:
   (a) fabricating a MOS transistor structure having an upper silicon contact region comprising a silicon gate electrode region, and two lower silicon contact regions comprising respectively a source and a drain region, said lower silicon contact, gate electrode, source and drain regions all having top and bottom surfaces, said gate electrode region also having a plurality of vertical surfaces and being vertically offset from said source region and from drain region by a substantially horizontally-oriented offset area, said offset area comprising silicon dioxide and being substantially under the entire bottom surface of said gate electrode region and at least partially over the top surface of a lower silicon contact region;

(b) forming a first and a second spacer oxide regions, said first spacer oxide region being in contact with the top surface of the source region, at least one vertical surface of the gate electrode region, the offset area, said first spacer oxide region being situated below the top surface of the gate electrode region
said second spacer oxide region being in contact with the top surface of the drain region, at least one vertical surface of the gate electrode region, the offset area, said second spacer oxide region being situated below the top surface of the gate electrode region;

(c) depositing a titanium film directly over and onto said MOS transistor structure, said top surface of both said source and drain regions, said top and vertical surfaces of said gate electrode region, and said spacer oxide regions;

(d) depositing a nitrogen-rich titanium nitride film over said titanium film;

(e) annealing said MOS transistor structure to form:
a first titanium silicide region having a top surface and being substantially over the entire top surface of said source region and partially over the spacer oxide region on said source region,
a second titanium silicide region having a top surface and being substantially over the entire top surface of said drain region and partially over the spacer oxide region on said drain region,
a third titanium silicide region having a top surface and being substantially over the entire top surface of said gate electrode region, substantially above said vertical surfaces of said gate electrode region, and substantially above and completely out of contact with the spacer oxide regions contacting said vertical surfaces of said gate electrode region, and to form titanium nitride regions in said titanium film, substantially entirely the top surface of said source, drain, and gate electrode regions, and both in contact with and substantially entirely over said first and second spacer oxide regions so as to inhibit diffusion of silicon between said gate electrode region and said source and drain regions not covered by said spacer oxide regions; and (f) etching excess titanium nitride and titanium from said top surfaces of said source, drain, and gate electrode regions, said spacer oxide regions, and said integrated circuit structure.

11. A method for preparing titanium silicide contact areas on MOS transistor structures as defined in claim 10, further comprising the step of selectively depositing a silicon layer over the gate electrode and over the source and drain regions of the transistor structure.

12. A method for preparing titanium silicide contact areas on MOS transistor structures as defined in claim 10, wherein the ratio of nitrogen to titanium in the nitrogen-rich titanium nitride film is in the range from about 1 to about 2.

13. A method for preparing titanium silicide contact areas on MOS transistor structures as defined in claim 10, wherein the ratio of nitrogen to titanium in the nitrogen-rich titanium nitride film is in the range from about 1.1 to about 1.3.

14. A method for preparing titanium silicide contact areas on MOS transistor structures as defined in claim 10, wherein the titanium film is deposited by sputtering.

15. A method for preparing titanium silicide contact areas on MOS transistor structures as defined in claim 10, wherein the nitrogen-rich titanium nitride film is deposited by reactive sputtering.

16. A method for preparing titanium silicide contact areas on MOS transistor structures which inhibit formation of titanium silicide short circuit paths between the gate electrode regions and the source/drain regions of the MOS transistor structure, the method comprising the steps of:

(a) fabricating a MOS transistor structure having an upper silicon contact region comprising a silicon gate electrode region, and two lower silicon contact regions comprising respectively a source and a drain region, said lower silicon contact, gate electrode, source and drain regions all having top and bottom surfaces, said gate electrode region also having a plurality of vertical surfaces and being vertically offset from said source region and from drain region by a substantially horizontally-oriented offset area, said offset area comprising silicon dioxide and being substantially under the entire bottom surface of said gate electrode region and at least partially over the top surface of a lower silicon contact region;

(b) forming a first and a second spacer oxide regions, said first spacer oxide region being in contact with the top surface of the source region, at least one vertical surface of the gate electrode region, the offset area, said first spacer oxide region being situated below the top surface of the gate electrode region, said second spacer oxide region being in contact with the top surface of the drain region, at least one vertical surface of the gate electrode region, the offset area, said second spacer oxide region being situated below the top surface of the gate electrode region;

(c) selectively depositing a silicon layer over said top surface of both said source and drain regions, said top and vertical surfaces of said gate electrode region, said spacer oxide regions, and over said MOS transistor structure;

(d) depositing a titanium film over said MOS transistor structure, wherein said titanium film is deposited by sputtering;

(e) depositing a nitrogen-rich titanium nitride film over said titanium film wherein the ratio of nitrogen to titanium in said nitrogen-rich titanium nitride film is in the range from about 1 to about 2 and wherein said nitrogen-rich titanium nitride film is deposited by reactive sputtering;

(f) annealing said MOS transistor structure to form:
a first titanium silicide region having a top surface and being substantially over the entire top surface of said source region and partially over the spacer oxide region on said source region, a second titanium silicide region having a top surface and being substantially over the entire top surface of said drain region and partially over the spacer oxide region on said drain region, a third titanium silicide region having a top surface and being substantially over the entire top surface of said gate electrode region, substantially above said vertical surfaces of said gate electrode region, and substantially above and completely out of contact with the spacer oxide regions contacting said vertical surfaces of said gate electrode region, and to form titanium nitride regions in said titanium film, substantially entirely the top surface of said source, drain, and gate electrode regions, and both in contact with and substantially entirely over said first and second spacer oxide regions so as to inhibit diffusion of silicon from said gate electrode and said source/drain regions not covered by said spacer oxide regions; and (g) etching excess titanium nitride and titanium from said MOS transistor structure, said top surfaces of said source, drain, and gate electrode regions, and from said spacer oxide regions.

17. A method for preparing titanium silicide contact areas on MOS transistor structures as defined in claim 16, wherein the ratio of nitrogen to titanium in the nitrogen-rich titanium nitride film is in the range from about 1.1 to about 1.3.

* * * * *

UNITED STATES PATENT AND TRADEMARK OFFICE
CERTIFICATE OF CORRECTION

PATENT NO.  : 5,196,360

DATED       : March 23, 1993

INVENTOR(S) : TRUNG DRI DOAN et al.

It is certified that error appears in the above-identified patent and that said Letters Patent is hereby corrected as shown below:

```
Column 4, line 33, "an" should be. --and--
Column 8, line 8, delete ":"
Column 8, line 67, after "from" insert --said--
Column 9, line 6, "regions" should be --region--
Column 9, line 12, after "region" insert --;--
Column 10, line 31, "regions" should be --region--
```

Signed and Sealed this

Twenty-fifth Day of January, 1994

Attest:

BRUCE LEHMAN

Attesting Officer

Commissioner of Patents and Trademarks